(12) United States Patent
Nagai

(10) Patent No.: US 12,074,113 B2
(45) Date of Patent: Aug. 27, 2024

(54) SEMICONDUCTOR DEVICE HAVING ELECTRIC COMPONENT BUILT IN CIRCUIT BOARD

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/679,603

(22) Filed: Feb. 24, 2022

(65) Prior Publication Data

US 2022/0319998 A1  Oct. 6, 2022

(30) Foreign Application Priority Data

Mar. 30, 2021  (JP) ................................. 2021-058211

(51) Int. Cl.
*H01L 23/367* (2006.01)
*H01L 23/538* (2006.01)
(Continued)

(52) U.S. Cl.
CPC ........ *H01L 23/5389* (2013.01); *H01L 23/367* (2013.01); *H01L 25/072* (2013.01); *H01L 25/16* (2013.01); *H01L 25/18* (2013.01)

(58) Field of Classification Search
CPC . H05K 1/185; H05K 1/11; H05K 1/14; H05K 1/0296; H05K 1/0298;
(Continued)

(56) References Cited

U.S. PATENT DOCUMENTS

| 6,384,492 | B1 * | 5/2002 | Iversen ................. H01L 25/112 257/691 |
| 6,906,411 | B1 | 6/2005 | Katsura et al. |
| 8,168,893 | B2 * | 5/2012 | Ito ........................... H01L 24/19 361/818 |
| 10,229,895 | B2 | 3/2019 | Gottwald et al. |

(Continued)

FOREIGN PATENT DOCUMENTS

JP    2002270710 A    9/2002

OTHER PUBLICATIONS

U.S. Appl. No. 17/679,314, filed Feb. 24, 2022, Nagai et al.
U.S. Appl. No. 17/679,622, filed Feb. 24, 2022, Nagai et al.

*Primary Examiner* — Shaun M Campbell
*Assistant Examiner* — Teresa M. Arroyo
(74) *Attorney, Agent, or Firm* — Posz Law Group, PLC

(57) ABSTRACT

A semiconductor device includes: a substrate main body having a first surface and a second surface; an electric component arranged in the substrate main body; a first terminal and a second terminal arranged on the first surface or the second surface, respectively; a first internal conductor pattern arranged in a first circuit layer arranged between the electric component and the first surface, and electrically connected to the first terminal and the electric component; and a second internal conductor pattern arranged in a second circuit layer arranged between the electric component and the second surface, and electrically connected to the second terminal and the electric component. The first internal conductor pattern and the second internal conductor pattern are at least partially opposed to each other inside the substrate main body.

12 Claims, 7 Drawing Sheets

(51) Int. Cl.
*H01L 25/07* (2006.01)
*H01L 25/16* (2023.01)
*H01L 25/18* (2023.01)

(58) Field of Classification Search
CPC ............ H05K 2201/10; H01L 23/5389; H01L 23/367; H01L 25/072; H01L 25/16; H01L 25/18; H01L 23/52; H01L 24/00; H01L 24/83; H01L 24/32; H01L 24/73; H01L 24/85; H01L 24/92; H01L 24/29; H01L 25/50; H01L 25/0657; H01L 2224/32145; H01L 2224/32225; H01L 2224/73265; H01L 2224/83385; H01L 2224/8349; H01L 2224/83862; H01L 2224/2919; H01L 2224/45099; H01L 2224/8314; H01L 2224/83191; H01L 2224/92247; H01L 2224/48091; H01L 2224/48227; H01L 2224/834; H01L 2224/83493; H01L 2224/85399; H01L 2225/0651; H01L 2225/06562; H01L 23/3121; H01L 23/562; H01L 2924/00014; H01L 2924/181; H01L 2924/00012; H01L 2924/00
USPC ............................................ 361/761; 174/262
See application file for complete search history.

(56) References Cited

U.S. PATENT DOCUMENTS

| | | | |
|---|---|---|---|
| 2003/0127736 A1* | 7/2003 | Eto | H01L 25/0657 257/737 |
| 2005/0087849 A1 | 4/2005 | Morita et al. | |
| 2005/0179136 A1 | 8/2005 | Katsura et al. | |
| 2005/0207133 A1* | 9/2005 | Pavier | H05K 1/141 361/761 |
| 2008/0117608 A1* | 5/2008 | Seo | H01L 25/0657 29/852 |
| 2009/0230541 A1* | 9/2009 | Araki | H05K 1/186 257/693 |
| 2010/0025082 A1* | 2/2010 | Sasaoka | H05K 1/186 29/592.1 |
| 2010/0295170 A1* | 11/2010 | Komura | H01L 23/5389 257/E23.102 |
| 2011/0148545 A1* | 6/2011 | Choudhury | H01L 24/82 156/60 |
| 2011/0266666 A1* | 11/2011 | Maeda | H01L 24/20 438/126 |
| 2012/0314389 A1* | 12/2012 | Takenaka | H05K 3/4602 29/846 |
| 2015/0216054 A1* | 7/2015 | Standing | H01L 25/072 228/180.21 |
| 2016/0020194 A1* | 1/2016 | Gottwald et al. | H01L 25/072 |
| 2020/0303362 A1* | 9/2020 | Hoya | H01L 25/18 |

* cited by examiner

SEMICONDUCTOR DEVICE HAVING ELECTRIC COMPONENT BUILT IN CIRCUIT BOARD

CROSS REFERENCE TO RELATED APPLICATION

The present application claims the benefit of priority from Japanese Patent Application No. 2021-058211 filed on Mar. 30, 2021. The entire disclosure of the above application is incorporated herein by reference.

TECHNICAL FIELD

The present disclosure relates to a semiconductor device having an electric component built in a circuit board.

BACKGROUND

A conceivable technique teaches a semiconductor device. This semiconductor device includes a substrate main body, an electric component arranged in the substrate main body, a first conductor pattern arranged on the upper surface of the substrate main body, and a second conductor pattern arranged on the lower surface of the substrate main body. The first conductor pattern is connected to the electric component from above through a plurality of vias, and the second conductor pattern is connected to the electric component from below through the plurality of vias. The first conductor pattern and the second conductor pattern function as current paths for currents passing through the electric component.

SUMMARY

According to an example embodiment, a semiconductor device may include: a substrate main body having a first surface and a second surface; an electric component arranged in the substrate main body; a first terminal and a second terminal arranged on the first surface or the second surface, respectively; a first internal conductor pattern arranged in a first circuit layer arranged between the electric component and the first surface, and electrically connected to the first terminal and the electric component; and a second internal conductor pattern arranged in a second circuit layer arranged between the electric component and the second surface, and electrically connected to the second terminal and the electric component. The first internal conductor pattern and the second internal conductor pattern are at least partially opposed to each other inside the substrate main body.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
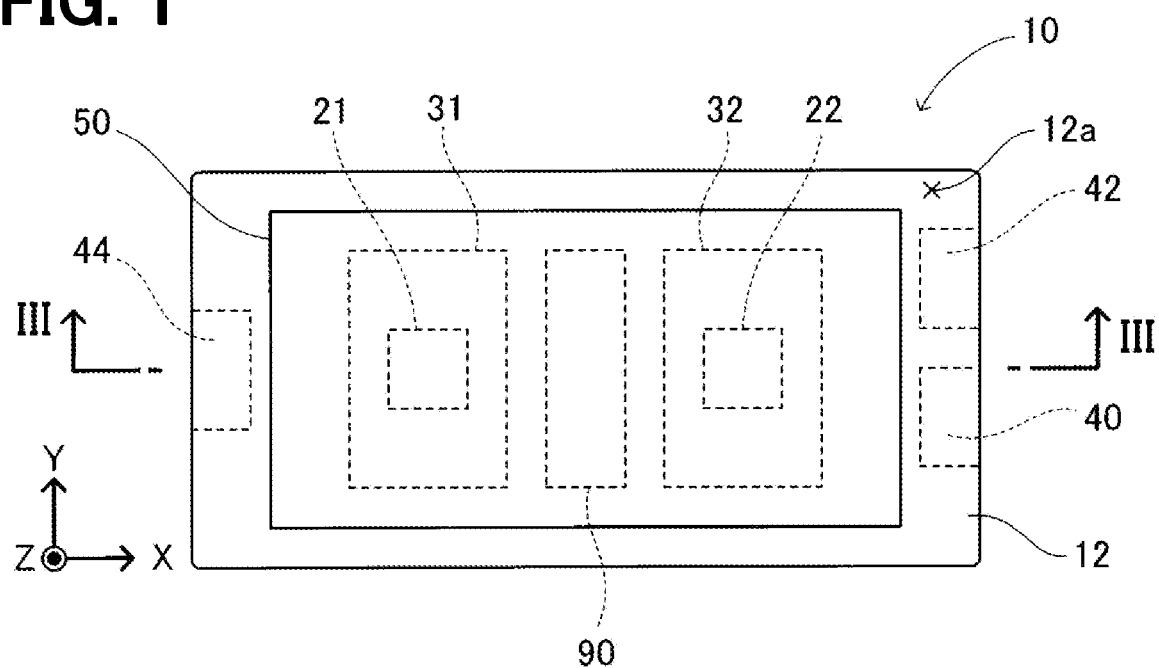
FIG. 1 is a plan view showing a semiconductor device of the first embodiment.

In a conceivable semiconductor device, it is required to reduce the inductance of the current path in order to suppress the loss in the current path. In order to reduce the inductance of the current path, it is effective to arrange two or more current paths connected to the electric component in parallel in an opposite direction. However, when two current paths are distributed on the upper surface and the lower surface of the substrate main body as in a conceivable semiconductor device, it is difficult to obtain sufficiently the effect of two current paths arranged in parallel to each other since there is a certain distance between two current paths.

In view of the above, the present embodiments provide a technique capable of reducing the inductance of the current path in a semiconductor device in which an electric component is built in a circuit board.

The semiconductor device disclosed in the present embodiment includes: a substrate main body having a first surface and a second surface; an electric component arranged in the substrate main body; a first terminal and a second terminal arranged on the first surface or the second surface; a first circuit layer arranged between the electric component and the first surface; a first internal conductor pattern arranged in the first circuit layer and electrically connected to the first terminal and the electric component; a second circuit layer arranged between the electric component and the second surface; and a second internal conductor pattern arranged in the second circuit layer and electrically connected to the second terminal and the electric component. The first internal conductor pattern and the second internal conductor pattern are at least partially opposed to each other inside the substrate main body.

In the above configuration, the first internal conductor pattern and the second internal conductor pattern function as two current paths connected to the electric component. Since the first internal conductor pattern and the second internal conductor pattern are each provided in the circuit layer in the substrate main body, the distance between the first internal conductor pattern and the second internal conductor pattern is relatively small. As a result, the two current paths connected to the electric component can be established in parallel in an opposite direction in a relatively close positional relationship. In addition, the first internal conductor pattern is arranged between the first surface of the substrate main body and the electric component, and the second internal conductor pattern is arranged between the second surface of the substrate main body and the electric component. When the first internal conductor pattern and the second internal conductor pattern are distributed on both sides of the electric component in this way, the structure of the substrate main body can be designed symmetrically with respect to the thickness direction, and it is possible to suppress the non-uniform thermal deformation such as waviness and warp of the substrate main body.

In one embodiment of the present disclosure, the semiconductor device 10 may have a third internal conductor pattern 65, 66 provided in a circuit layer arranged in the same depth range as the electric component, and a first connection via 74, 78 that electrically connects one of the first internal conductor pattern and the second internal conductor pattern with the third internal conductor pattern. In this case, the third internal conductor pattern may be at least partially opposed to the other of the first internal conductor pattern and the second internal conductor pattern inside the substrate main body. According to such a configuration, the third internal conductor pattern functions as the same current path as the first internal conductor pattern or the second internal conductor pattern, so that the two current paths connected to the electric component are arranged closer to each other and in parallel to each other in a positional relationship.

In the above embodiment, the semiconductor device may have a fourth internal conductor pattern 66, 65 arranged in the same depth range as the electric component and at a depth different from the third internal conductor pattern, and a second connection via 77 that electrically connects the third internal conductor pattern and the fourth internal conductor pattern. In this case, the fourth internal conductor pattern may be at least partially opposed to the other of the first internal conductor pattern and the second internal conductor pattern inside the substrate main body. According to such a configuration, in addition to the third internal conductor pattern, the fourth internal conductor pattern also functions as the same current path as the first internal conductor pattern or the second internal conductor pattern. As a result, two current paths connected to the electric component can be established in parallel to each other in a closer positional relationship.

Alternatively, the semiconductor device may include, instead of the second connection, a third connection via 78 that electrically connects the other of the first internal conductor pattern and the second internal conductor pattern with the fourth internal conductor pattern. According to such a configuration, the third internal conductor pattern and the fourth internal conductor pattern, which are close to each other, can function as two current paths connected to the electric component. As a result, two current paths connected to the electric component can be established in parallel to each other in a closer positional relationship.

In one embodiment of the present disclosure, at least one of the thickness of the first internal conductor pattern and the thickness TH of the second internal conductor pattern may be larger than the thickness of the other internal conductor patterns in the substrate main body. According to such a configuration, the effect of reducing the inductance by increasing the cross-sectional area can be expected in at least one of the two current paths connected to the electric component. Further, by increasing the thickness of the internal conductor pattern, it is possible to expect the cooling effect of the electric component by improving the thermal conductivity.

In one embodiment of the present disclosure, at least one of the first internal conductor pattern and the second internal conductor pattern may have an opening 67a in a range facing the electric component. In the range where the electric component is interposed between the two current paths, the effect of establishing the two current paths in parallel may be reduced. Therefore, in the range facing the electric component, more current may be concentrated on other parts where the effect of parallel establishment is expected by deleting the current path.

In one embodiment of the present disclosure, the semiconductor device may further include a surface electric component 52 provided on the first surface and controlling the operation of the electric component. According to the configuration of the present disclosure, it is possible to suppress the temperature rise of the semiconductor device by reducing the loss in the current path. Therefore, even when the surface electric component is arranged on the first surface of the substrate main body, it is possible to avoid a situation in which the surface electric component may be overheated.

In one embodiment of the present disclosure, the electric component may include a power semiconductor device 21, 22 and a heat sink plate 31, 32 to which the power semiconductor element is bonded. Since a relatively large current flows through a power semiconductor device, it is strongly required to reduce the impedance in the current path. The configurations disclosed herein can be suitably adopted for semiconductor devices including such power semiconductor devices.

Embodiment 1

The semiconductor device 10 of the first embodiment will be described with reference to the drawings. The semiconductor device 10 of this embodiment is adopted, for example, in a power control unit of an electric vehicle, and can form a part of a power conversion circuit for power conversion between a power supply and a traveling motor. The electric vehicle in the present embodiment broadly means a vehicle having a motor for driving wheels, and for example, an electric vehicle charged by an external electric power, a hybrid vehicle having an engine in addition to the motor, a fuel cell vehicle having a fuel cell as the power source and the like. However, the application of the semiconductor device 10 according to the embodiment may not be limited to the electric vehicle, and may be applied to a variety of electrical apparatuses.

Figure 2:
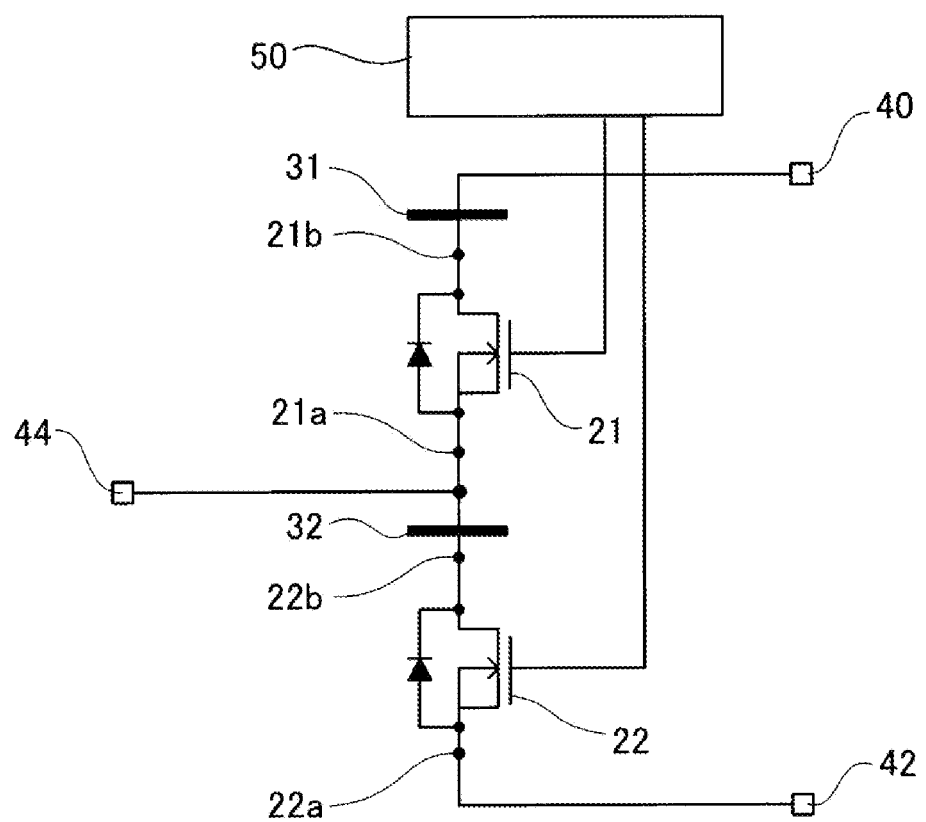
FIG. 2 is a circuit diagram showing a circuit structure of the semiconductor device of the first embodiment.
Figure 3:
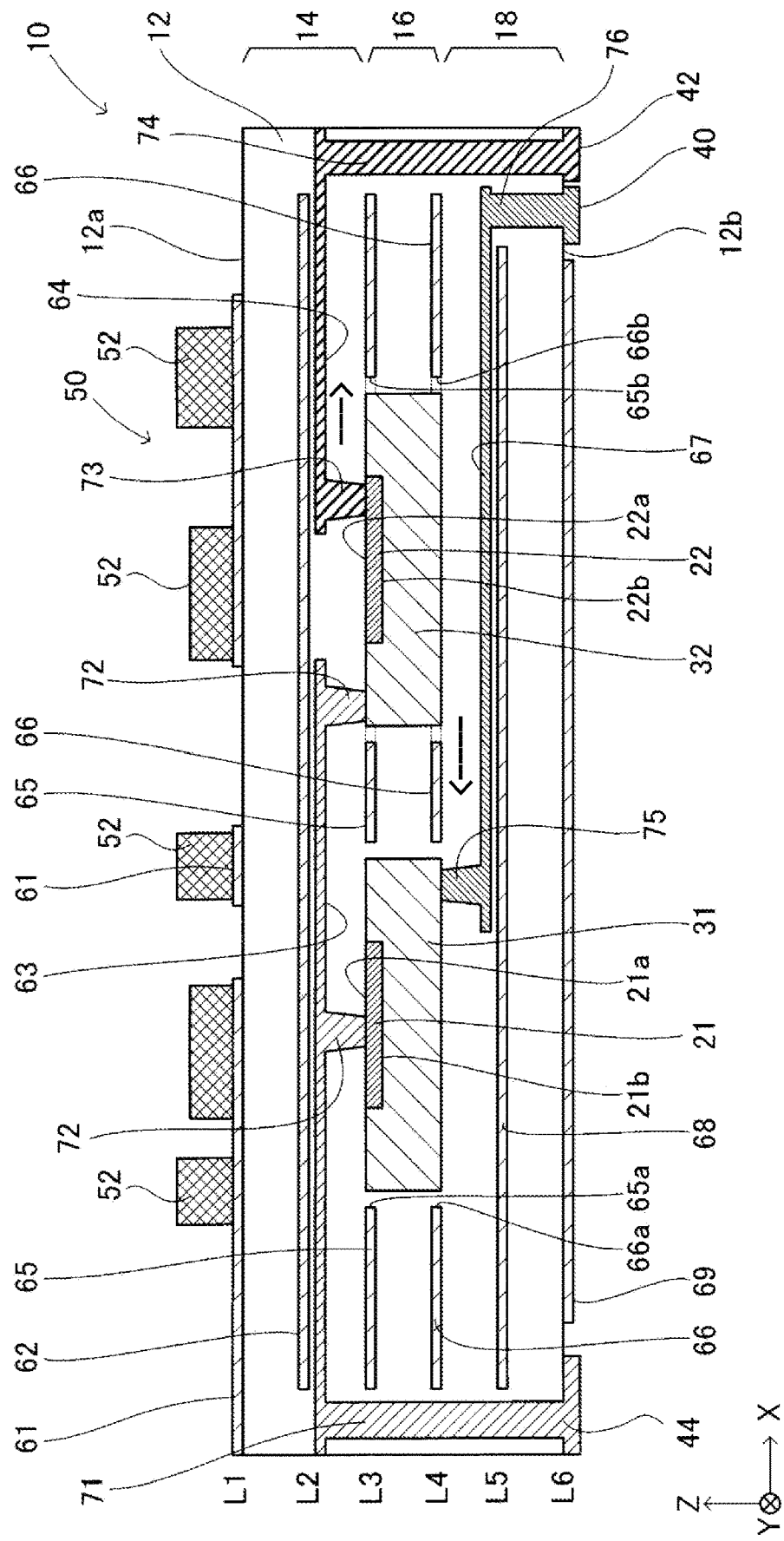
FIG. 3 is a cross-sectional view taken along the line III-III in FIG. 1, and for clarity of the drawing, hatching of the substrate main body is omitted, and further, some of the overlapping configurations are shown by intentionally changing their positions.

As shown in FIGS. 1 to 3, the semiconductor device 10 includes a substrate main body 12, two semiconductor elements 21 and 22, and two heat sink plates 31 and 32. The substrate main body 12 has a boarded shape or a plate-like shape. The substrate main body 12 has an upper surface 12a and a lower surface 12b. The lower surface 12b is arranged at a side opposite to the upper surface 12a. The substrate main body 12 is made of an insulator, for example, an epoxy resin or other resin material. The substrate main body 12 includes an upper layer 14, an intermediate layer 16, and a lower layer 18 in an order from the upper surface 12a to the lower surface 12b. The upper layer 14 is a layer including the upper surface 12a of the substrate main body 12. The lower layer 18 is a layer including the lower surface 12b of the substrate main body 12. The intermediate layer 16 is a layer arranged between the upper layer 14 and the lower layer 18.

X-direction and Y-direction in the drawings are directions parallel to the upper surface 12a and the lower surface 12b of the substrate main body 12, and are directions perpendicular to each other. Z-direction is a direction perpendicular to the upper surface 12a and the lower surface 12b of the substrate main body 12, and is a direction perpendicular to each of the X-direction and the Y-direction. That is, the above-mentioned upper layer 14, the intermediate layer 16 and the lower layer 18 are stacked along the Z direction.

The semiconductor elements 21 and 22 and the heat sink plates 31 and 32 are electric components that form a part of an electric circuit in the semiconductor device 10, respectively, and are a set of electric components that are electrically connected to each other inside the substrate main body 12. The two semiconductor elements 21 and 22 are arranged in the intermediate layer 16 of the substrate main body 12 together with the two heat sink plates 31 and 32. Each of the semiconductor elements 21 and 22 is a power semiconductor element, and in particular, a switching element. This switching element may be, for example, an Insulated Gate Bipolar Transistor (IGBT) or a Metal-Oxide-Semiconductor Field-Effect Transistor (MOSFET). The semiconductor elements 21 to 22 respectively have upper surface electrodes 21a to 22a and lower surface electrodes 21b to 22b, and respectively conduct electricity or block an electrical conduction between the corresponding upper surface electrodes 21a to 22a and the corresponding lower surface electrodes 21b to 22b.

As an example, the two semiconductor elements 21 and 22 include a first semiconductor element 21 and a second semiconductor element 22. The first semiconductor element 21 and the second semiconductor element 22 are electrically connected in series inside the substrate main body 12. As described above, the two semiconductor elements 21 and 22 are switching elements such as IGBTs or MOSFETs. The semiconductor device 10 of this embodiment can form, for example, a part of an inverter circuit or a DC-DC converter circuit. The number of semiconductor elements 21 and 22 may not be limited to two. Further, the semiconductor device 10 may include at least one other electric component in place of the semiconductor elements 21 and 22 and the heat sink plates 31 and 32.

The two heat sink plates 31 and 32 each have a plate-like shape and are arranged in parallel with the substrate main body 12. Each heat sink plate 31, 32 is made of a conductor, for example copper or other metal. As an example, the two heat sink plates 31 and 32 are arranged along the X direction. The two heat sink plates 31 and 32 include a first heat sink plate 31 and a second heat sink plate 32. A first semiconductor element 21 is arranged on the first heat sink plate 31, and the lower surface electrode 21b of the first semiconductor element 21 is electrically connected to the first heat sink plate 31. Similarly, the second semiconductor element 22 is arranged on the second heat sink plate 32, and the lower surface electrodes 21b and 22b of the second semiconductor element 22 are electrically connected to the second heat sink plate 32.

The semiconductor device 10 includes a plurality of terminals 40, 42, 44. These terminals 40, 42, and 44 are external connection terminals for connecting to an external circuit. The plurality of terminals 40, 42, 44 are made of a conductor such as copper or other metal. As an example, the plurality of terminals 40, 42, and 44 include a P terminal 40, an N terminal 42, and an O terminal 44. The plurality of terminals 40, 42, and 44 are arranged on the lower surface 12b of the substrate main body 12. Here, a part or all of the plurality of terminals 40, 42, 44 may be arranged on the upper surface 12a of the substrate main body 12.

The P terminal 40 is electrically connected to the first heat sink plate 31 inside the substrate main body 12, and is electrically connected to the lower surface electrode 21b of the first semiconductor element 21 through the first heat sink plate 31. The N terminal 42 is electrically connected to the upper surface electrode 22a of the second semiconductor element 22 inside the substrate main body 12. The O terminal 44 is electrically connected to the upper surface electrode 21a of the first semiconductor element 21 and the second heat sink plate 32 inside the substrate main body 12. That is, the O terminal 44 is electrically connected to each of the upper surface electrode 21a of the first semiconductor element 21 and the lower surface electrode 22b of the second semiconductor element 22. As a result, when the first semiconductor element 21 is turned on, the P terminal 40 and the O terminal 44 are electrically connected to each other. On the other hand, when the second semiconductor element 22 is turned on, the N terminal 42 and the O terminal 44 are electrically connected to each other.

The substrate main body 12 is provided with a plurality of circuit layers L1-L6 to form a multi-layer substrate structure. The plurality of circuit layers L1-L6 include a first circuit layer L1, a second circuit layer L2, a third circuit layer L3, a fourth circuit layer L4, a fifth circuit layer L5, and a sixth circuit layer L6. The first circuit layer L1 is arranged on the upper surface 12a of the substrate main body 12. The second circuit layer L2 is arranged in the upper layer 14 of the substrate main body 12. The third circuit layer L3 is arranged at the boundary between the upper layer 14 and the intermediate layer 16 of the substrate main body 12. The fourth circuit layer L4 is arranged at the boundary between the intermediate layer 16 and the lower layer 18 of the substrate main body 12. The fifth circuit layer L5 is arranged in the lower layer 18 of the substrate main body 12. The sixth circuit layer L6 is arranged on the lower surface 12b of the substrate main body 12.

The first circuit layer L1 has a first conductor pattern 61. The first conductor pattern 61 is made of a conductor such as copper or other metal. The first conductor pattern 61 constitutes a control circuit 50 that controls two semiconductor elements 21 and 22. Therefore, a plurality of surface electric components 52 are mounted on the first conductor pattern 61. The plurality of surface electric components 52 include, for example, a gate drive circuit that controls switching of the semiconductor elements 21 and 22.

The first conductor pattern 61 referred to here is a general term for one or more conductor patterns required to form the control circuit 50. That is, the first conductor pattern 61 may be a single conductor pattern or a combination of a plurality of conductor patterns. The same applies to the second conductor pattern 62 to the ninth conductor pattern 69 described below. Each of the second conductor pattern 62 to the ninth conductor pattern 69 is a general term for one or more conductor patterns having a common function, and may be a single conductor pattern or a combination of a plurality of conductor patterns.

The second circuit layer L2 has a plurality of conductor patterns 62, 63, 64. Each conductor pattern 62, 63, 64 is made of a conductor such as copper or other metal. The plurality of conductor patterns 62, 63, 64 include a second conductor pattern 62, a third conductor pattern 63, and a fourth conductor pattern 64. Here, the plurality of conductor patterns 62, 63, 64 are actually arranged on the same plane, but in FIG. 3, the second conductor pattern 62 is intentionally displaced with respect to the third conductor pattern 63 and the fourth conductor pattern 64 for the purpose of clarifying the illustration.

The second conductor pattern 62 extends over most of the second circuit layer L2 and is provided so as to face the plurality of semiconductor elements 21 and 22. As a result, the heat generated in the semiconductor elements 21 and 22 is diffused to a wide range of the substrate main body 12 through the second conductor pattern 62. The second conductor pattern 62 also functions as a shield layer that shields electromagnetic noise radiated from the semiconductor elements 21 and 22. Although not particularly limited, the second conductor pattern 62 may be connected to the ground potential, thereby improving the function of the second conductor pattern 62 as a shield layer.

The third conductor pattern 63 is connected to the O terminal 44 through the first via 71. In addition, the third conductor pattern 63 is connected to the upper surface electrode 21a of the first semiconductor element 21 and the second heat sink plate 32 through two second vias 72. The first via 71 and the second via 72 are made of a conductor such as copper or other metal. As a result, the two semiconductor elements 21 and 22 are electrically connected in series by the second conductor pattern 62 and electrically connected to the O terminal 44 through the second conductor pattern 62. The third conductor pattern 63 constitutes a part of the current path through which the current flows through the semiconductor elements 21 and 22 and the heat sink plates 31 and 32 as a set of electric components.

The fourth conductor pattern 64 is connected to the upper surface electrode 22a of the second semiconductor element 22 through the third via 73. In addition, the fourth conductor pattern 64 is connected to the N terminal 42 through the fourth via 74. The third via 73 and the fourth via 74 are made of a conductor such as copper or other metal. As a result, the upper surface electrode 22a of the second semiconductor element 22 is electrically connected to the N terminal 42 through the fourth conductor pattern 64.

Semiconductor elements 21 and 22 and heat sink plates 31 and 32 are arranged in the third circuit layer L3 and the fourth circuit layer L4. The heat sink plates 31 and 32 have a thickness equal to the distance from the third circuit layer L3 to the fourth circuit layer L4. The semiconductor elements 21 and 22 arranged on the heat sink plates 31 and 32 are arranged in the third circuit layer L3. In addition, the third circuit layer L3 and the fourth circuit layer L4 are provided with a fifth conductor pattern 65 and a sixth conductor pattern 66, respectively. Each conductor pattern 65, 66 is made of a conductor such as copper or other metal. The usage of the fifth conductor pattern 65 and the sixth conductor pattern 66 in this embodiment may not be particularly limited. The fifth conductor pattern 65 and the sixth conductor pattern 66 may be connected to, for example, a ground potential.

The fifth conductor pattern 65 of the third circuit layer L3 is arranged in the substrate main body 12 in the same depth range as the heat sink plates 31 and 32. The depth range here means a range in the Z direction. Therefore, the fifth conductor pattern 65 is provided with two openings 65a and 65b in accordance with the two heat sink plates 31 and 32. That is, in FIG. 3, the fifth conductor pattern 65 is divided and shown at the positions of the two heat sink plates 31 and 32, but the actual fifth conductor pattern 65 are formed integrally in a wide range of the third circuit layer L3.

Similarly, the sixth conductor pattern 66 of the fourth circuit layer L4 is arranged in the substrate main body 12 in the same depth range as the heat sink plates 31 and 32. The depth range here means a range in the Z direction. Therefore, the sixth conductor pattern 66 is also provided with two openings 66a and 66b in accordance with the two heat sink plates 31 and 32. That is, in FIG. 3, the sixth conductor pattern 66 is divided and shown at the positions of the two heat sink plates 31 and 32, but the actual sixth conductor pattern 66 is integrally formed in a wide range of the fourth circuit layer L4.

The fifth circuit layer L5 has a plurality of conductor patterns 67, 68. Each conductor pattern 67, 68 is made of a conductor such as copper or other metal. The plurality of conductor patterns 67 and 68 include a seventh conductor pattern 67 and an eighth conductor pattern 68. Here, the plurality of conductor patterns 67, 68 are actually arranged on the same plane, but in FIG. 3, the seventh conductor pattern 67 is intentionally displaced with respect to the eighth conductor pattern 68 for the purpose of clarifying the illustration.

The seventh conductor pattern 67 is connected to the first heat sink plate 31 through the fifth via 75. In addition, the seventh conductor pattern 67 is connected to the P terminal 40 through the sixth via 76. The fifth via 75 and the sixth via 76 are made of a conductor such as copper or other metal. As a result, the lower surface electrode 21b of the first semiconductor element 21 is electrically connected to the P terminal 40 through the first heat sink plate 31 and the seventh conductor pattern 67. The seventh conductor pattern 67 constitutes a part of the current path through which the current flows through the semiconductor elements 21 and 22 and the heat sink plates 31 and 32 as a set of electric components.

The eighth conductor pattern 68 extends over most of the fifth circuit layer L5 and is provided so as to face the plurality of semiconductor elements 21 and 22. As a result, the heat generated in the semiconductor elements 21 and 22 is diffused to a wide range of the substrate main body 12 through the eighth conductor pattern 68. The eighth conductor pattern 68 also functions as a shield layer that shields electromagnetic noise radiated from the semiconductor elements 21 and 22. Although not particularly limited, the eighth conductor pattern 68 may be connected to the ground potential, thereby improving the function of the eighth conductor pattern 68 as a shield layer.

The sixth circuit layer L6 has a ninth conductor pattern 69. The ninth conductor pattern 69 extends over most of the sixth circuit layer L6 and faces the eighth conductor pattern 68 of the fifth circuit layer L5. The ninth conductor pattern 69 is made of a conductor such as copper or other metal. The heat generated in the semiconductor elements 21 and 22 is diffused not only through the eighth conductor pattern 68 but also through the ninth conductor pattern 69 to a wide range of the substrate main body 12. The ninth conductor pattern 69 also functions as a shield layer that shields electromagnetic noise radiated from the semiconductor elements 21 and 22. Similar to the eighth conductor pattern 68, the ninth conductor pattern 69 may be connected to the ground potential, thereby improving the function of the ninth conductor pattern 69 as a shield layer.

As described above, in the semiconductor device 10 of this embodiment, a set of electric components including the semiconductor elements 21 and 22 and the heat sink plates 31 and 32 is arranged in the intermediate layer 16 of the substrate main body 12. The P terminal 40 and the N terminal 42 are provided on the lower surface 12b of the board body 12. Inside the substrate main body 12, a fourth conductor pattern 64 is provided on the second circuit layer L2 arranged between the intermediate layer 16 and the upper surface 12a, and a seventh conductor pattern 67 is provided on the fifth circuit layer L5 arranged between the intermediate layer 16 and the lower surface 12b. The fourth conductor pattern 64 is electrically connected to the N terminal 42 and the second semiconductor element 22, and functions as a current path of a current flowing through an electric component of the substrate main body 12. The seventh conductor pattern 67 is also electrically connected to the P terminal 40 and the first heat sink plate 31, and functions as a current path of a current flowing through an electric component of the substrate main body 12 (that is, the semiconductor elements 21, 22 and the heat sink plates 31, 32). The fourth conductor pattern 64 and the seventh conductor pattern 67 are at least partially opposed to each other inside the substrate main body 12.

As described above, the semiconductor device 10 has a circuit structure in which two semiconductor elements 21 and 22 which are switching elements are connected in series, and constitutes a part of an inverter circuit and a DC-DC converter circuit. In the inverter circuit and the DC-DC converter circuit, the two semiconductor elements 21 and 22 are controlled to turn on alternately, and as a result, the current flows through the fourth conductor pattern 64 and the seventh conductor pattern 67 in an opposite direction. At this time, the fourth conductor pattern 64 and the seventh conductor pattern 67 are at least partially opposed to each other inside the substrate main body 12, and the two current paths are established in parallel in opposite directions (as indicated by opposing dotted arrows in FIG. 3). As a result, the impedance in the two conductor patterns 64 and 67 is reduced. In particular, the fourth conductor pattern 64 and the seventh conductor pattern 67 are provided in the circuit layers L2 and L5 in the substrate main body 12, respectively, and the distance between the two conductor patterns 64 and 67 is relatively small. Therefore, the impedance in the two conductor patterns 64, 67 is effectively reduced.

Here, in order to bring the fourth conductor pattern 64 and the seventh conductor pattern 67 close to each other, it is conceivable to arrange the two conductor patterns 64, 67 in the same upper layer 14 (or the same lower layer 18). However, if the structure is such that the two conductor patterns 64 and 67 are arranged on the same side with respect to a set of electric components including the semiconductor elements 21 and 22 and the heat sink plates 31 and 32, the structure of the substrate main body 12 is formed to be asymmetrical in the thickness direction, which may lead to non-uniform thermal deformation such as warpage and waviness of the substrate main body 12. On the other hand, in the semiconductor device 10 of the present embodiment, the fourth conductor pattern 64 and the seventh conductor pattern 67 are arranged in the upper layer 14 and the lower layer 18 of the substrate main body 12, respectively, and the device 10 has the structure in which the patterns 64, 67 are distributed on both sides of a set of electric components. According to such a configuration, the structure of the substrate main body 12 can be designed symmetrically with respect to the thickness direction, such as making the thicknesses of the upper layer 14 and the lower layer 18 equal to each other, and non-uniform thermal deformation of the substrate main body 12 can be suppressed.

The semiconductor device 10 according to the first embodiment is an embodiment of the technique disclosed in the present specification, and the content of the present technique is not particularly limited. The substrate main body 12 in this embodiment is an example of the substrate in the present technology. The upper surface 12a and the lower surface 12b of the substrate main body 12 in this embodiment are examples of the first surface and the second surface of the substrate main body in the present technology, respectively. The first semiconductor element 21, the second semiconductor element 22, the first heat sink plate 31, and the second heat sink plate 32 in this embodiment are examples of electric components in the present technology. The N terminal 42 and the P terminal 40 in this embodiment are examples of the first terminal and the second terminal in the present technology, respectively. The fourth conductor pattern 64 in this embodiment is an example of the first internal conductor pattern in the present technology. The seventh conductor pattern 67 in this embodiment is an example of the second internal conductor pattern in the present technology. The surface electric component 52 in this embodiment is an example of the surface electric component in the present technology.

Embodiment 2

Figure 4:
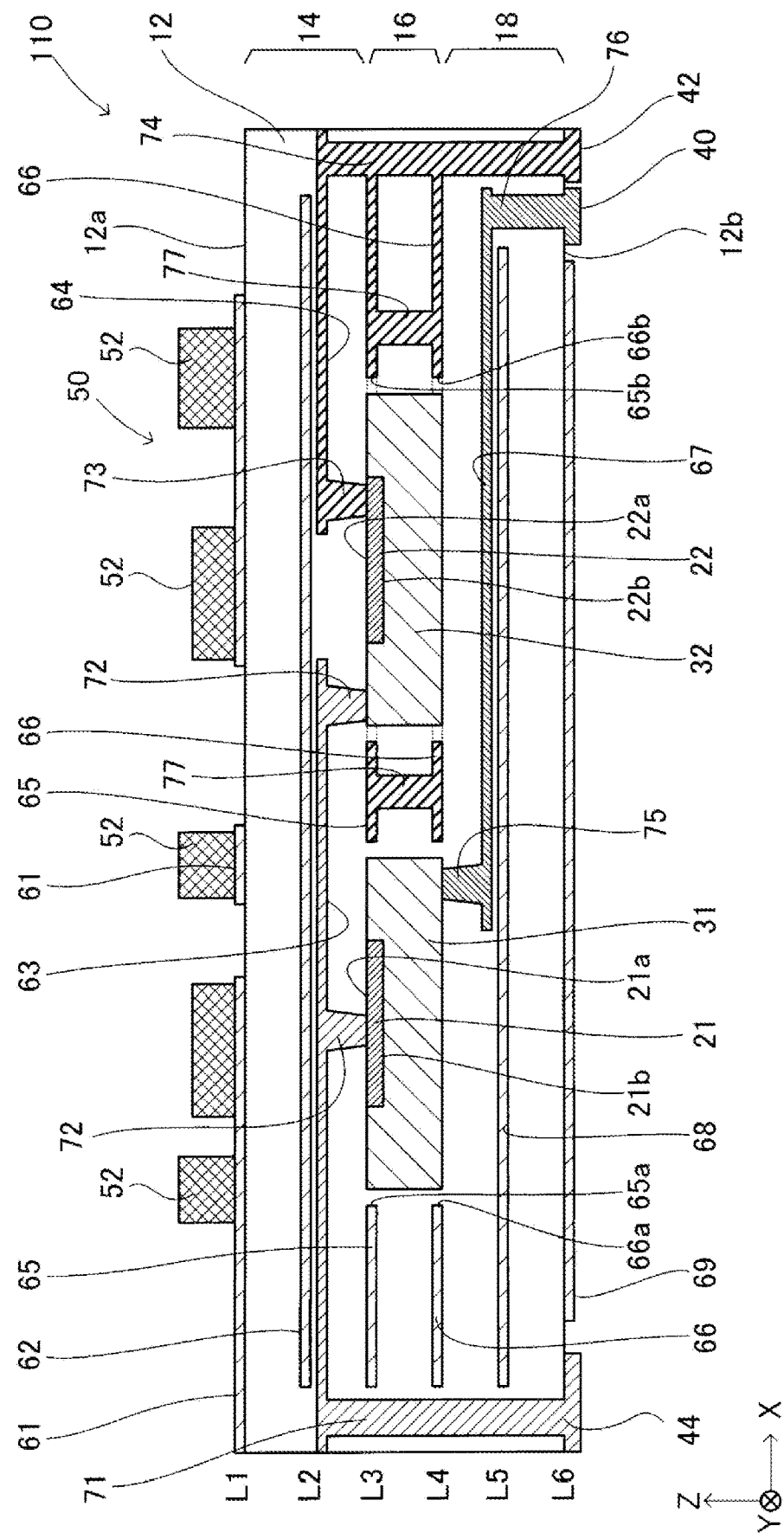
FIG. 4 is a cross-sectional view showing the configuration of the semiconductor device of the second embodiment.

The semiconductor device 110 of the second embodiment will be described with reference to FIG. 4. In the semiconductor device 110 of this embodiment, the fifth conductor pattern 65 of the third circuit layer L3 and the sixth conductor pattern 66 of the fourth circuit layer L4 are electrically connected to the fourth conductor pattern 64, and this point is different from the semiconductor device 10 of the first embodiment. In the following, the differences from the first embodiment will be mainly described, and the same reference numerals will be given to the configurations common to the first embodiment, and the description thereof will be omitted.

The fifth conductor pattern 65 and the sixth conductor pattern 66 are provided in the third circuit layer L3 or the fourth circuit layer L4, and are arranged in the same depth range as the semiconductor elements 21 and 22 and the heat sink plates 31 and 32. The fifth conductor pattern 65 and the sixth conductor pattern 66 are connected to the fourth conductor pattern 64 through the fourth via 74. Further, at least one seventh via 77 is provided on the intermediate layer 16 of the substrate main body 12. The seventh via 77 is made of a conductor such as copper or other metal. As a result, the fifth conductor pattern 65 and the sixth conductor pattern 66 are electrically connected to each other. As is clear from FIG. 4, the fifth conductor pattern 65 and the sixth conductor pattern 66 are closer to the seventh conductor pattern 67 than the fourth conductor pattern 64. That is, each distance from the fifth conductor pattern 65 or the sixth conductor pattern 66 to the seventh conductor pattern 67 is smaller than the distance from the fourth conductor pattern 64 to the seventh conductor pattern 67.

According to the configuration of this embodiment, the fifth conductor pattern 65 and the sixth conductor pattern 66 function as the same current path as the fourth conductor pattern 64. The fifth conductor pattern 65 and the sixth conductor pattern 66, which function as current paths, are close to the seventh conductor pattern 67, which is a current path that is established in parallel in the opposite direction. As a result, the impedance in the semiconductor device 110 is further reduced.

The semiconductor device 110 according to the second embodiment is an embodiment of the technique disclosed in the present specification, and the content of the present technique is not particularly limited. The fifth conductor pattern 65 in this embodiment is an example of the third internal conductor pattern in the present technology. The sixth conductor pattern 66 in this embodiment is an example of the fourth internal conductor pattern in the present technology. The fourth via 74 in this embodiment is an example of the first connection via in the present technology. The seventh via 77 in this embodiment is an example of the second connection via in the present technology.

Embodiment 3

Figure 5:
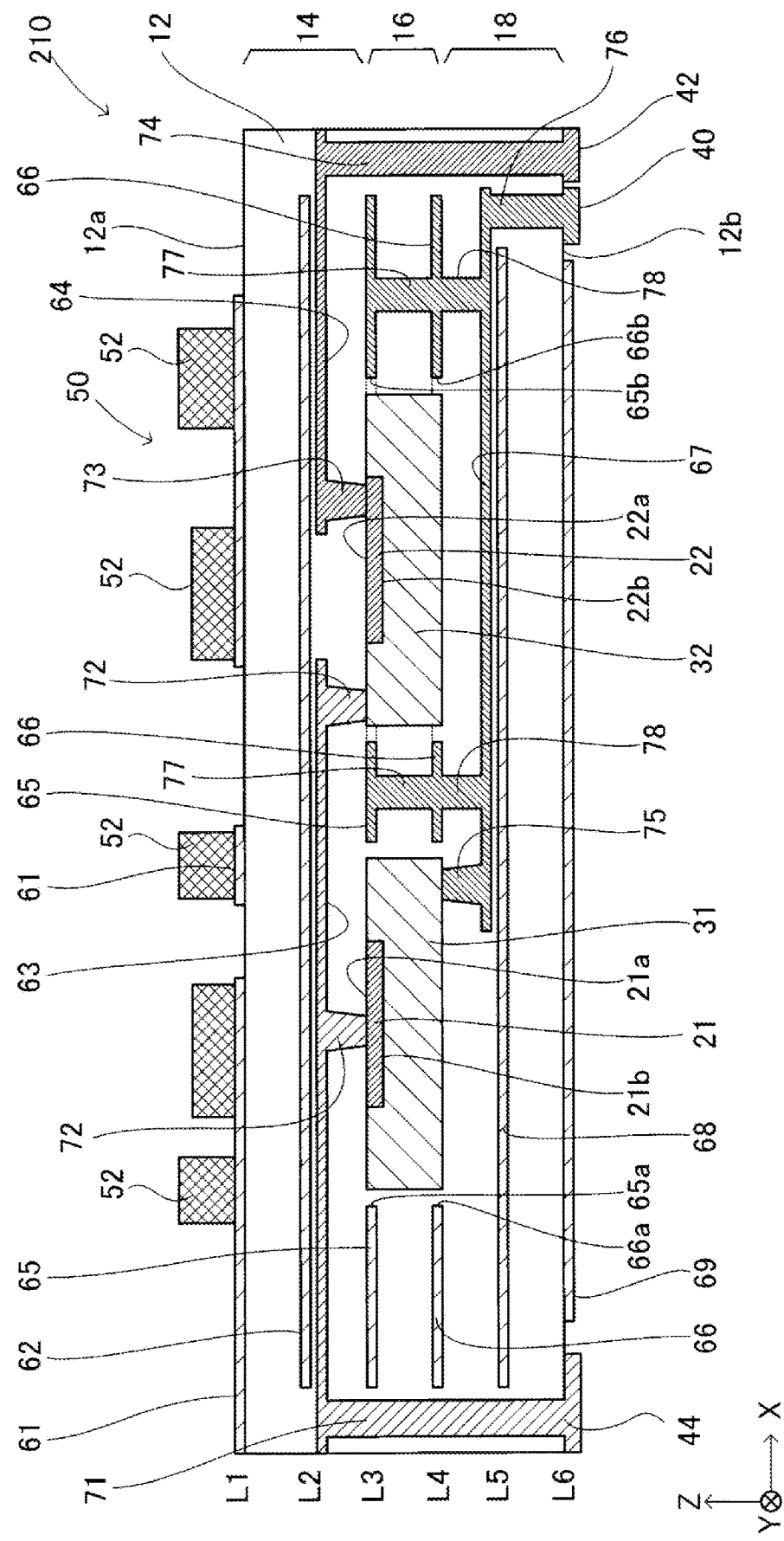
FIG. 5 is a cross-sectional view showing the configuration of the semiconductor device according to the third embodiment.

The semiconductor device 210 of the third embodiment will be described with reference to FIG. 5. In the semiconductor device 210 of this embodiment, the fifth conductor pattern 65 of the third circuit layer L3 and the sixth conductor pattern 66 of the fourth circuit layer L4 are electrically connected to the seventh conductor pattern 67, and this point is different from the semiconductor devices 10, 110 of the first and second embodiments. In the following, the differences from the first and second embodiments will be mainly described, and the same reference numerals will be given to the configurations common to the first and second embodiments, and the description thereof will be omitted.

The semiconductor device 210 of this embodiment further includes at least one eighth via 78. The eighth via 78 is arranged between the fourth circuit layer L4 and the fifth circuit layer L5, and connects the sixth conductor pattern 66 and the seventh conductor pattern 67 to each other. The eighth via 78 is made of a conductor such as copper or other metal. As a result, the sixth conductor pattern 66 and the seventh conductor pattern 67 are electrically connected to each other. In addition, the intermediate layer 16 of the substrate main body 12 is provided with at least one seventh via 77, as in the second embodiment. As is clear from FIG. 4, the fifth conductor pattern 65 and the sixth conductor pattern 66 are closer to the fourth conductor pattern 64 than the seventh conductor pattern 67. That is, each distance from the fifth conductor pattern 65 or the sixth conductor pattern 66 to the fourth conductor pattern 64 is smaller than the distance from the seventh conductor pattern 67 to the fourth conductor pattern 64.

According to the configuration of this embodiment, the fifth conductor pattern 65 and the sixth conductor pattern 66 function as the same current path as the seventh conductor pattern 67. The fifth conductor pattern 65 and the sixth conductor pattern 66, which function as current paths, are close to the fourth conductor pattern 64, which is a current path that is established in parallel in the opposite direction. As a result, the impedance in the semiconductor device 210 is further reduced.

The semiconductor device 210 according to the third embodiment is an embodiment of the technique disclosed in the present specification, and the content of the present technique is not particularly limited. The sixth conductor pattern 66 in this embodiment is an example of the third internal conductor pattern in the present technology. The fifth conductor pattern 65 in this embodiment is an example of the fourth internal conductor pattern in the present technology. The eighth via 78 in this embodiment is an example of the first connection via in the present technology. The seventh via 77 in this embodiment is an example of the second connection via in the present technology.

Embodiment 4

Figure 6:
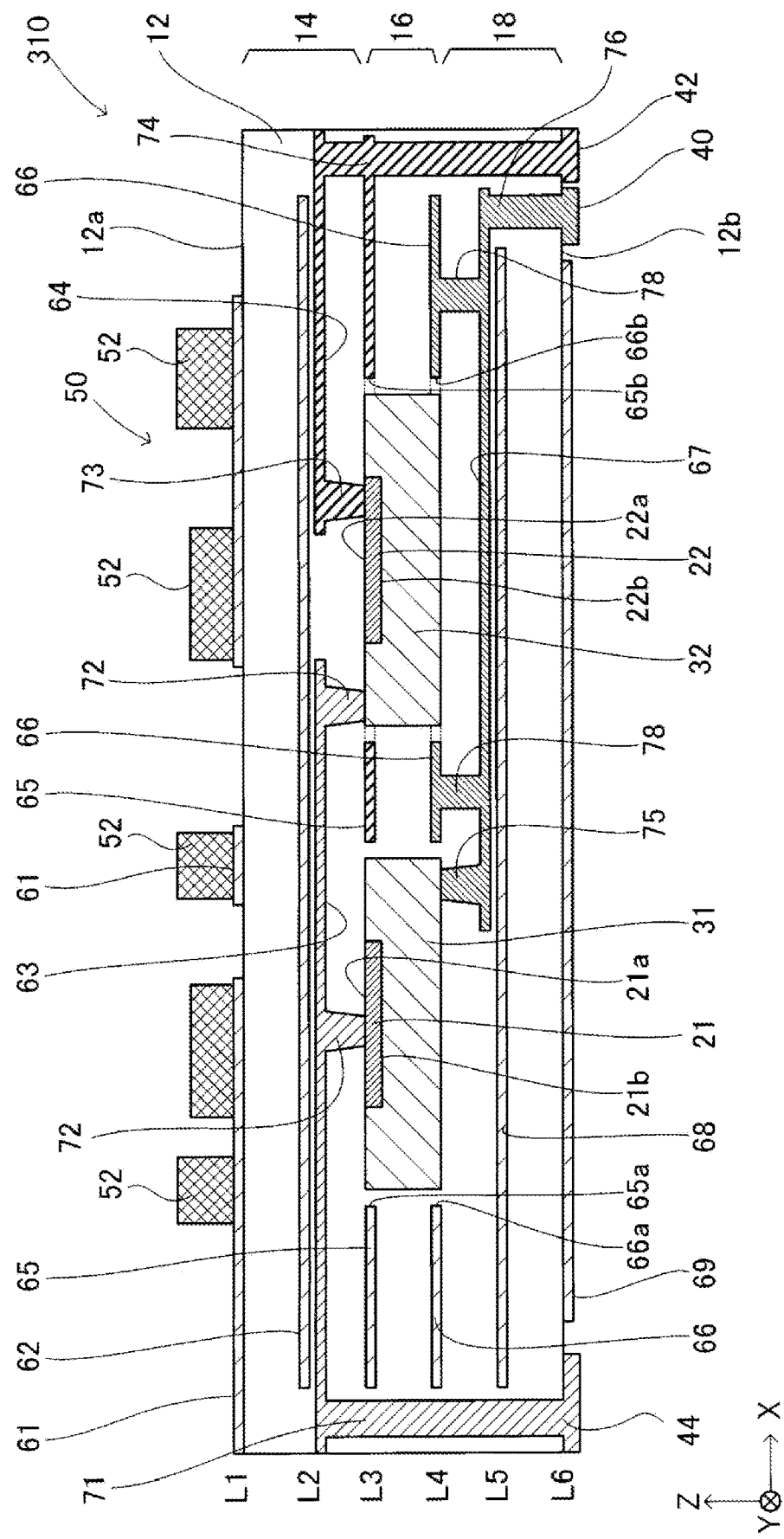
FIG. 6 is a cross-sectional view showing the configuration of the semiconductor device of the fourth embodiment.

The semiconductor device 310 of the fourth embodiment will be described with reference to FIG. 6. In the semiconductor device 310 of this embodiment, the fifth conductor pattern 65 of the third circuit layer L3 is electrically connected to the fourth conductor pattern 64, and the sixth conductor pattern 66 of the fourth circuit layer L4 is electrically connected to the seventh conductor pattern 67. In these respects, the semiconductor device 310 of this embodiment is different from the semiconductor devices 10, 110, 210 of Embodiments 1-3. In the following, the differences from the first to third embodiments will be mainly described, and the same reference numerals will be given to the configurations common to the first to third embodiments, and the description thereof will be omitted.

In the semiconductor device 310 of this embodiment, the fifth conductor pattern 65 is connected to the fourth conductor pattern 64 through the fourth via 74. On the other hand, the sixth conductor pattern 66 is connected to the seventh conductor pattern 67 through at least one eighth via 78. The fifth conductor pattern 65 and the sixth conductor pattern 66 are arranged in the same depth range as the semiconductor elements 21 and 22 and the heat sink plates 31 and 32, and are close to each other.

According to the configuration of this embodiment, the fifth conductor pattern 65 functions as the same current path as the fourth conductor pattern 64, and the sixth conductor pattern 66 functions as the same current path as the seventh conductor pattern 67. The impedance in the semiconductor device 310 is further reduced when the fifth conductor pattern 65, which functions as a current path, is close to the sixth conductor pattern 66, which functions as a current path that is established in parallel in the opposite direction.

The semiconductor device 310 according to the fourth embodiment is an embodiment of the technique disclosed in the present specification, and the content of the present technique is not particularly limited. The fifth conductor pattern 65 in this embodiment is an example of the third internal conductor pattern in the present technology. The sixth conductor pattern 66 in this embodiment is an example of the fourth internal conductor pattern in the present technology. The fourth via 74 in this embodiment is an example of the first connection via in the present technology. The eighth via 78 in this embodiment is an example of the third connection via in the present technology.

Embodiment 5

Figure 7:
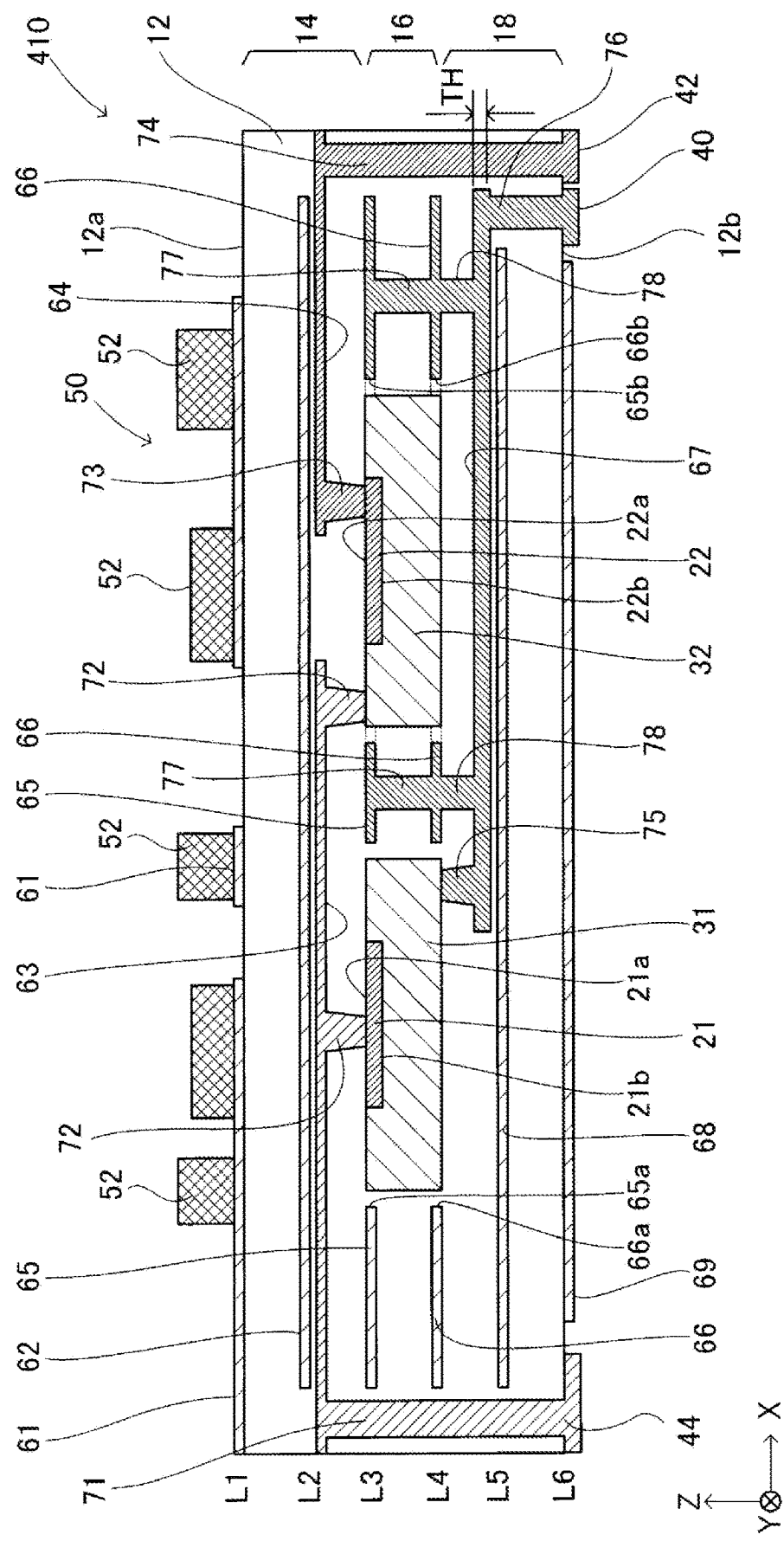
FIG. 7 is a cross-sectional view showing the configuration of the semiconductor device of the fifth embodiment.

The semiconductor device 410 of the fifth embodiment will be described with reference to FIG. 7. In the semiconductor device 410 of the present embodiment, the thickness TH of the seventh conductor pattern 67 is larger than the thickness of the other conductor patterns 61-66, 68, 69, and in this respect, the semiconductor device 410 is different from the semiconductor device 210 of the third embodiment. In the following, the differences from the third embodiment will be mainly described, and the same reference numerals will be given to the configurations common to the third embodiment, and the description thereof will be omitted.

By increasing the thickness TH of the 7th conductor pattern 67, the cross-sectional area increases as the current path of the seventh conductor pattern 67. Thereby, the effect of reducing the inductance can be expected. Further, by increasing the thickness of the seventh conductor pattern 67, the thermal conductivity of the seventh conductor pattern 67 is improved, and the cooling effect of the semiconductor elements 21 and 22 and the heat sink plates 31 and 32 can be expected.

The semiconductor device 310 according to the fifth embodiment is an embodiment of the technique disclosed in the present specification, and the content of the present technique is not particularly limited. Instead of or in addition to the seventh conductor pattern 67, the thickness of the fourth conductor pattern 64 may be increased. Further, the configuration according to this embodiment can be similarly adopted in other embodiments disclosed in the present specification.

Embodiment 6

Figure 8:
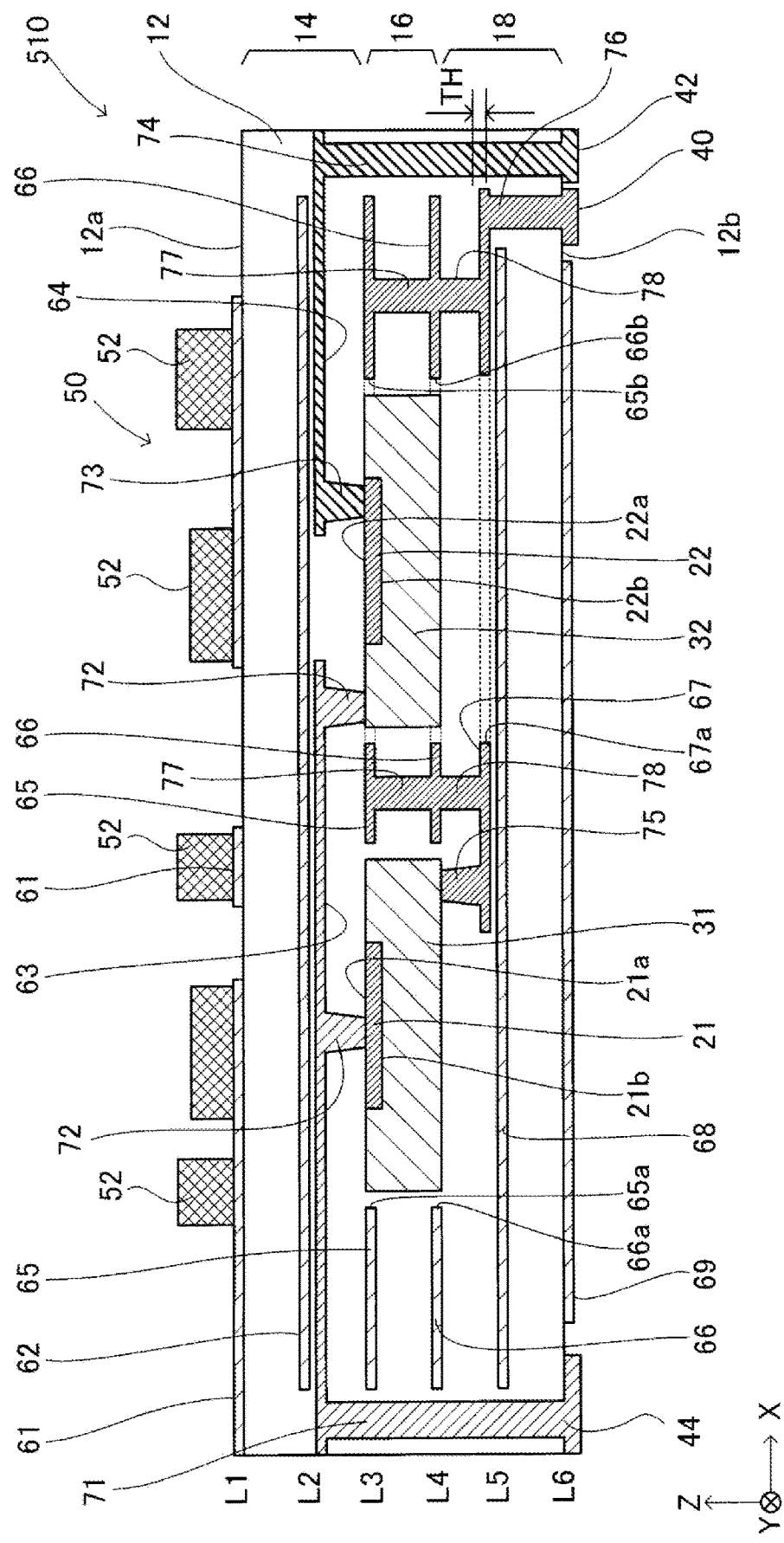
FIG. 8 is a cross-sectional view showing the configuration of the semiconductor device of the sixth embodiment.

The semiconductor device 510 of the sixth embodiment will be described with reference to FIG. 8. In the semiconductor device 510 of the present embodiment, the opening 67a is provided in the seventh conductor pattern 67, which is different from the semiconductor device 210 of the third embodiment. In the following, the differences from the third embodiment will be mainly described, and the same reference numerals will be given to the configurations common to the third embodiment, and the description thereof will be omitted.

The opening 67a of the seventh conductor pattern 67 is provided in a range facing the second heat sink plate 32. In the range where the second heat sink plate 32 is interposed between the fourth conductor pattern 64 and the seventh conductor pattern 67 which function as a current path, the effect when the fourth conductor pattern 64 and the seventh conductor pattern 67 are established in parallel may be reduced. Therefore, in the range facing the second heat sink plate 32, a larger amount of current may be concentrated on other portions where the effect of parallel path is expected, by deleting the seventh conductor pattern 67.

The semiconductor device 510 according to the sixth embodiment is an embodiment of the technique disclosed in the present specification, and the content of the present technique is not particularly limited. A similar opening may be provided in the fourth conductor pattern 64 in place of or in addition to the seventh conductor pattern 67. Further, the configuration according to this embodiment can be similarly adopted in other embodiments disclosed in the present specification.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
   a substrate main body having a first surface and a second surface;
   an electric component arranged in the substrate main body;
   a first terminal and a second terminal both arranged on one of the first surface and the second surface;
   a first internal conductor pattern arranged in a first circuit layer arranged between the electric component and the first surface, and electrically connected to the first terminal and the electric component; and
   a second internal conductor pattern arranged in a second circuit layer arranged between the electric component and the second surface, and electrically connected to the second terminal and the electric component, wherein:
   the first internal conductor pattern and the second internal conductor pattern are at least partially opposed to each other inside the substrate main body,
   the electric component includes a first semiconductor element and a second semiconductor element, each of the first semiconductor element and the second semiconductor element including a power semiconductor element and a heat sink plate to which the power semiconductor element is bonded,
   each heat sink plate is arranged in the substrate main body and is in contact with its corresponding bonded power semiconductor element
   the first semiconductor element and the second semiconductor element are arranged side by side, both disposed between the first internal conductor pattern and the second internal conductor pattern in a stacking direction, and
   a current path of the first internal conductor pattern is in parallel and opposite to a current path of the second internal conductor pattern.

2. The semiconductor device according to claim 1, further comprising:
   a third internal conductor pattern arranged in a third circuit layer arranged in a same depth range as the electric component; and
   a first connection via for electrically connecting one of the first internal conductor pattern and the second internal conductor pattern with the third internal conductor pattern, wherein:
   the third internal conductor pattern is at least partially opposed to the other of the first internal conductor pattern and the second internal conductor pattern inside the substrate main body.

3. The semiconductor device according to claim 2, further comprising:
   a fourth internal conductor pattern arranged in the same depth range as the electric component and at a depth different from the third internal conductor pattern; and
   a second connection via for electrically connecting the third internal conductor pattern and the fourth internal conductor pattern, wherein:
   the fourth internal conductor pattern is at least partially opposed to the other of the first internal conductor pattern and the second internal conductor pattern inside the substrate main body.

4. The semiconductor device according to claim 2, further comprising:
   a fourth internal conductor pattern arranged in the same depth range as the electric component and at a depth different from the third internal conductor pattern; and
   a third connection via for electrically connecting the other of the first internal conductor pattern and the second internal conductor pattern with the fourth internal conductor pattern, wherein:
   the third internal conductor pattern and the fourth internal conductor pattern are at least partially opposed to each other inside the substrate main body.

5. The semiconductor device according to claim 1, wherein:
   at least one of a thickness of the first internal conductor pattern and a thickness of the second internal conductor pattern is larger than a thickness of an other internal conductor pattern in the substrate main body.

6. The semiconductor device according to claim 1, wherein:
   at least one of the first internal conductor pattern and the second internal conductor pattern has an opening in a range facing the electric component.

7. The semiconductor device according to claim 1, further comprising:
   a surface electric component arranged on the first surface and controlling an operation of the electric component.

8. The semiconductor device according to claim 1, wherein:
   the first internal conductor pattern and the second internal conductor pattern are at least partially opposed to each other inside the substrate main body in a direction that is orthogonal to the first surface and the second surface.

9. The semiconductor device according to claim 1, wherein:
   the first semiconductor element comprises a first power semiconductor element and a first heat sink plate, the second semiconductor element comprises a second power semiconductor element and a second heat sink plate, the first heat sink plate and the first power semiconductor element are disposed in the substrate main body and are in contact with each other, the second heat sink plate and the second power semiconductor element are disposed in the substrate main body and are in contact with each other, the first heat sink plate in contact with the first power semiconductor element are separated by an interval of the substrate main body from the second heat sink plate in contact with the second power semiconductor element;

the first internal conductor pattern extends from the first terminal in a direction orthogonal to a stacking direction of the semiconductor device and contacts the first power semiconductor element from above in the stacking direction through a first via, and the second internal conductor pattern extends from the second terminal in the direction orthogonal to the stacking direction and contacts the second power semiconductor element from below in the stacking direction through a second via.

10. The semiconductor device according to claim 9, wherein in extending from the second terminal in the direction orthogonal to the stacking direction, the second internal conductor pattern passes under, in the stacking direction, the first heat sink plate in contact with the first power semiconductor element.

11. A semiconductor device comprising:

a substrate main body having a first surface and a second surface;

an electric component arranged in the substrate main body;

a first terminal and a second terminal both arranged on one of the first surface and the second surface;

a first internal conductor pattern arranged in a first circuit layer arranged between the electric component and the first surface, and electrically connected to the first terminal and the electric component; and a second internal conductor pattern arranged in a second circuit layer arranged between the electric component and the second surface, and electrically connected to the second terminal and the electric component, wherein:

the first internal conductor pattern and the second internal conductor pattern are at least partially opposed to each other inside the substrate main body, the electric component comprises a first power semiconductor element and a second power semiconductor element, the first power semiconductor element is separated by an interval of the substrate main body from the second power semiconductor element;

the first internal conductor pattern extends from the first terminal in a direction orthogonal to a stacking direction of the semiconductor device and contacts the first power semiconductor element from above in the stacking direction through a first via, the second internal conductor pattern extends from the second terminal in the direction orthogonal to the stacking direction and contacts the second power semiconductor element from below in the stacking direction through a second via, the first power semiconductor element and the second power semiconductor element are arranged side by side, both disposed between the first internal conductor pattern and the second internal conductor pattern in the stacking direction, and a current path of the first internal conductor pattern is in parallel and opposite to a current path of the second internal conductor pattern.

12. The semiconductor device according to claim 11, wherein in extending from the second terminal in the direction orthogonal to the stacking direction, the second internal conductor pattern passes under, in the stacking direction, the first power semiconductor element.

* * * * *